(12) United States Patent
Cheek et al.

(10) Patent No.: US 6,372,587 B1
(45) Date of Patent: Apr. 16, 2002

(54) ANGLED HALO IMPLANT TAILORING USING IMPLANT MASK

(75) Inventors: Jon D. Cheek, Round Rock; Scott D. Luning; Derick J. Wristers, both of Austin, all of TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/568,069

(22) Filed: May 10, 2000

(51) Int. Cl.[7] .............................................. H01L 21/336
(52) U.S. Cl. ........................................ 438/302; 438/303
(58) Field of Search ............................. 438/302, 45, 185, 438/298, 296, 305, 525; 257/306, 382, 386, 296, 302, 380

(56) References Cited

U.S. PATENT DOCUMENTS 6,020,244 A * 2/2000 Thompson et al. ......... 438/302
6,083,794 A * 7/2000 Hook et al. ................ 438/286

* cited by examiner

Primary Examiner—David Nelms
Assistant Examiner—Dung A Le
(74) Attorney, Agent, or Firm—Williams, Morgan & Amerson

(57) ABSTRACT

A method is provided for forming a halo implant in a substrate adjacent one side of a structure, the method including forming the structure above a surface of the substrate, the structure having first and second edges and forming a mask defining a region adjacent the structure, the mask having a thickness $\tau$ above the surface and having an edge disposed a distance $\delta$ from the first edge of the structure. The method also includes implanting the halo implant at an angle $\alpha$ with respect to a direction perpendicular to the surface, wherein the tangent of the angle $\alpha$ is at least the ratio of the distance $\delta$ to the thickness $\tau$.

20 Claims, 12 Drawing Sheets

US 6,372,587 B1

ANGLED HALO IMPLANT TAILORING USING IMPLANT MASK

BACKGROUND OF THE INVENTION

1. FIELD OF THE INVENTION

This invention relates generally to semiconductor fabrication technology, and, more particularly, to a method of forming a halo implant in a substrate adjacent one side of a structure such as a gate structure of a transistor.

2. DESCRIPTION OF THE RELATED ART

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate dielectric thickness, and the like, are reduced. For example, all other things being equal, the smaller the channel length of the FET, the faster the transistor will operate. Thus, there is a constant drive to reduce the size, or scale, of the components of a typical transistor to increase the overall speed of the transistor, as well as integrated circuit devices incorporating such transistors. Additionally, reducing the size, or scale, of the components of a typical transistor also increases the density, and number, of the transistors that can be produced on a given amount of wafer real estate, lowering the overall cost per transistor as well as the cost of integrated circuit devices incorporating such transistors.

However, reducing the channel length of a transistor also increases "short-channel" effects, almost by definition. Short-channel effects include, among other things, an increased drain-source leakage current when the transistor is supposed to be switched "off," due to source/drain depletion regions being closer together because of the shorter channel length. Short-channel effects also include "threshold roll-off" (i.e., the threshold voltage $V_{th}$ decreasing as gate length is reduced), and the like.

Short-channel effects may be reduced by using angled halo implants. Angled halo implants are implants of dopants that effectively "reinforce" the doping type of the substrate in the channel between the source/drain extension (SDE) regions (formerly known as lightly doped drain or LDD regions). For example, for an N-MOS transistor, the doping type of the substrate in the channel between the n-type source/drain extension (SDE) regions is p-type. The angled halo implant may be boron (B) or boron difluoride ($BF_2$) implanted into the substrate at an angle (with respect to a direction perpendicular to the surface of the substrate), and with a dose that may range from about $1.0 \times 10^{12}$–$1.0 \times 10^{14}$ ions/cm$^2$ at an implant energy ranging from about 5–15 keV for B and about 20–70 keV for $BF_2$.

Similarly, for a P-MOS transistor, the doping type of the substrate in the channel between the p-type source/drain extension (SDE) regions is n-type. The angled halo implant may be arsenic (As) implanted into the substrate at an angle (with respect to a direction perpendicular to the surface of the substrate), and with a dose that may range from about $1.0 \times 10^{12}$–$1.0 \times 10^{14}$ ions/cm$^2$ at an implant energy ranging from about 40–70 keV for As.

As shown in FIG. 1, for example, a metal oxide semiconductor field effect transistor (MOSFET or MOS transistor) 100 may be formed on a semiconducting substrate 105, such as doped-silicon. The MOS transistor 100 may have a doped-polycrystalline silicon (doped-polysilicon or doped-poly) gate 110 formed above a gate oxide 115 formed above the semiconducting substrate 105. The doped-poly gate 110 and the gate oxide 115 may be separated from $N^+$-doped ($P^+$-doped) source/drain regions 120 of the MOS transistor 100 by dielectric spacers 125. The dielectric spacers 125 may be formed above shallow N-doped (P-doped) source/drain extension (SDE) regions 130.

As shown in FIG. 1, $P^-$-doped ($N^-$-doped) angled halo implants 135 are typically provided adjacent the N-doped (P-doped) SDE regions 130 to reduce some of the short-channel effects described above. In particular, by "reinforcing" the p-doping (n-doping) type of the semiconducting substrate 105 in the channel between the N-doped (P-doped) SDE regions 130, the laterally non-uniform $P^-$-doped ($N^-$-doped) angled halo implants 135 may be better at controlling the threshold roll-off (i.e., the threshold voltage $V_{th}$ decreasing as gate length is reduced), thereby reducing short-channel induced effects such as a non-zero drain-source leakage current when the transistor is supposed to be switched "off," (i.e., "off-state" leakage). As shown in FIG. 1, shallow trench isolation (STI) regions 140 may be provided to isolate the MOS transistor 100 electrically from neighboring semiconductor devices such as other MOS transistors (not shown).

As shown in FIG. 2, only one $P^-$-doped ($N^-$-doped) angled halo implant 235 typically needs to be provided adjacent the N-doped (P-doped) SDE region 230 adjacent the $N^+$-doped ($P^+$-doped) source region 220 of the MOS transistor 200 to reduce some of the short-channel effects described above. Note that elements of the MOS transistor 200 that are substantially identical to the elements of the MOS transistor 100 as shown in FIG. 1 are numbered identically.

As shown in FIG. 3, a conventional technique for implanting the asymmetric $P^-$-doped ($N^-$-doped) angled halo implant 235 is schematically illustrated. A structure 300 (that will eventually become a gate structure for an MOS transistor such as the MOS transistor 200, as described above), having a doped-poly gate 110 and a gate dielectric 115, may be masked by a mask 310. The mask 310 may be formed of photoresist, for example, and may have a thickness in a range of about 5000 Å15000 Å.

As shown in FIG. 3, a halo dopant 320 (indicated by directed lines) may be implanted to introduce dopant atoms and/or molecules to form the asymmetric $P^-$-doped ($N^-$-doped) angled halo implant 235 only under the lefthand side of the structure 300. As shown in FIG. 3, an angle θ of the halo dopant 320 with respect to an upper surface 145 of the semiconducting substrate 105 may lie within a range of about 25°–65°.

Typically, the semiconducting substrate 105 is tilted at the angle θ with respect to a horizontal direction in an implanter (not shown) and the halo dopant 320 is directed downward in a vertical direction. Alternatively, the semiconducting substrate 105 could be disposed in the horizontal direction in the implanter (not shown) and the halo dopant 320 could be directed downward at the angle θ with respect to the horizontal direction in the implanter, and/or any other combination of tilt and implant direction could be used as long as the angle θ is the relative angle of the halo dopant 320 with respect to the upper surface 145 of the semiconducting substrate 105.

After implanting one side of the structure 300, the semiconducting substrate 105 is typically rotated through 180° and the halo dopant 320 is again implanted so that the angle θ is the relative angle of the halo dopant 320 with respect to the upper surface 145 of the semiconducting substrate 105. If the mask 310 were not present, such symmetrical implanting of both sides of the structure 300 would result in symmetrical angled halo implants similar to the angled halo implants 135 shown in FIG. 1. With the mask 310 present, however, symmetrical implanting of both sides of the structure 300 results in an asymmetrical angled halo implant similar to the asymmetrical angled halo implant 235 shown in FIGS. 2 and 3.

The halo dopant 320 may also be implanted into a region 330 (outlined in phantom) that will eventually become the N-doped (P-doped) SDE region 230, and into a region 320 (also outlined in phantom) that will eventually become the N$^+$-doped (P$^+$-doped) source region 220. However, the dosage of the halo dopant 320 is typically at least an order of magnitude less than the dosage of dopant for the N-doped (P-doped) SDE region 230. Similarly, the halo dopant 320 may also be implanted into the doped-poly gate 110 and/or the gate dielectric 115 and/or the mask 310. However, the doping of the doped-poly gate 110 also typically overwhelms the halo dopant 320 doping in the doped-poly gate 110. Furthermore, the amount of the halo dopant 320 doping in the gate dielectric 115 is typically miniscule, and the mask 310 is ultimately removed, rendering moot the presence of any of halo dopant 320 doping in the mask 310.

Typically, a dose of the halo dopant 320 atoms and/or molecules may range from approximately $1.0\times10^{12}$–$1.0\times10^{14}$ ions/cm$^2$ of the appropriate halo dopant 320 atoms and/or molecules, e.g., boron (B) or boron difluoride (BF$_2$) for an illustrative NMOS transistor (the p-type halo implant serving to reinforce the p-type doping of the channel region of the NMOS transistor), or arsenic (As) or phosphorus (P) for an illustrative PMOS transistor (the n-type halo implant serving to reinforce the n-type doping of the channel region of the PMOS transistor). An implant energy of the halo dopant 320 atoms and/or molecules may range from approximately 5–70 keV.

By way of contrast, a typical dose of dopant for the N-doped (P-doped) SDE region 230 may range from approximately $1.0\times10^{14}$–$1.0\times10^{15}$ ions/cm$^2$ of the appropriate dopant atoms and/or molecules, e.g., As or P for an illustrative NMOS transistor or B or BF$_2$ for an illustrative PMOS transistor. An implant energy of the N-doped (P-doped) SDE region 230 dopant atoms and/or molecules may range from approximately 3–50 keV. Similarly, a typical dose of dopant for the N$^+$-doped (P$^+$-doped) source region 220 may range from approximately $1.0\times10^{15}$–$1.0\times10^{15}$ ions/cm$^2$ of the appropriate dopant atoms and/or molecules, e.g., As or P for an illustrative NMOS transistor or B or BF$_2$ for an illustrative PMOS transistor. An implant energy of the N$^+$-doped (P$^+$-doped) source region 220 dopant atoms and/or molecules may range from approximately 30–100 keV.

The halo dopant 320 may be an N$^-$ implant such as P, As, antimony (Sb), and the like, and will form the N$^-$-doped angled halo implant 235. An N$^-$ implant would be appropriate for the fabrication of a PMOS transistor 200, for example, the n-type halo implant serving to reinforce the n-type doping of the channel region of the PMOS transistor 200. Alternatively, the halo dopant 320 may be a P$^-$ implant such as B, boron fluoride (BF, BF$_2$), Indium (In), and the like, and may form the P$^-$-doped angled halo implant 235. A P$^-$ implant would be appropriate for the fabrication of an NMOS transistor 200, for example, the p-type halo implant serving to reinforce the p-type doping of the channel region of the NMOS transistor 200.

However, the conventional technique schematically illustrated in FIG. 3 for implanting the asymmetric P$^-$-doped (N$^-$-doped) angled halo implant 235 necessarily entails an extra masking step to form the mask 310, adding yet another layer of complexity, increasing further the costs of fabrication and reducing throughput. Alternative conventional techniques for implanting the asymmetric P$^-$-doped (N$^-$-doped) angled halo implant 235, as shown in FIG. 4, impose severe restrictions on the design and layout of the MOS transistors on a workpiece (such as the semiconducting substrate 105 in FIG. 3) so that all of the N$^+$-doped (P$^+$-doped) source regions 220 are on the same side of the gate structures (such as structure 300 in FIG. 3).

As shown in FIG. 4, these alternative conventional techniques then use LDD or SDE mask(s) as mask(s) 410 to form the asymmetric P$^-$-doped (N$^-$-doped) angled halo implant 235. The LDD or SDE mask(s) 410 are used in conventional complementary MOS (CMOS) fabrication methods to protect the PMOS (NMOS) transistor regions while the NMOS (PMOS) transistor regions are being implanted to form the N-doped (P-doped) SDE regions 330 and 430 (outlined in phantom), for example. In addition to forming the asymmetric P$^-$-doped (N$^-$-doped) angled halo implant 235, the halo dopant 320 may also be implanted into a region 430 (outlined in phantom) that will eventually become the N-doped (P-doped) SDE region 130, forming an asymmetric P$^-$-doped (N$^-$-doped) angled halo implant 435 under one side of the mask(s) 410, for example. The angled halo dopant 320 is thus only implanted under one side of the gate structure(s) 300, the side having the region 320 (also outlined in phantom) that will eventually become the N$^+$-doped (P$^+$-doped) source region 220. However, the severe design and layout restrictions result in a sparser and less dense packing of the CMOS transistors on the workpiece and the addition of yet another layer of design and layout complexity, increasing the costs of fabrication and also reducing overall throughput.

The present invention is directed to overcoming, or at least reducing the effects of, one or more of the problems set forth above.

SUMMARY OF THE INVENTION

In one aspect of the present invention, a method is provided for forming a halo implant in a substrate adjacent one side of a structure, the method including forming the structure above a surface of the substrate, the structure having first and second edges and forming a mask defining a region adjacent the structure, the mask having a thickness τ above the surface and having an edge disposed a distance δ from the first edge of the structure. The method also includes implanting the halo implant at an angle α with respect to a direction perpendicular to the surface, wherein the tangent of the angle α is at least the ratio of the distance δ to the thickness τ.

BRIEF DESCRIPTION OF THE DRAWINGS

The invention may be understood by reference to the following description taken in conjunction with the accompanying drawings, in which the leftmost significant digit(s) in the reference numerals denote(s) the first figure in which the respective reference numerals appear, and in which.

Figure 1:
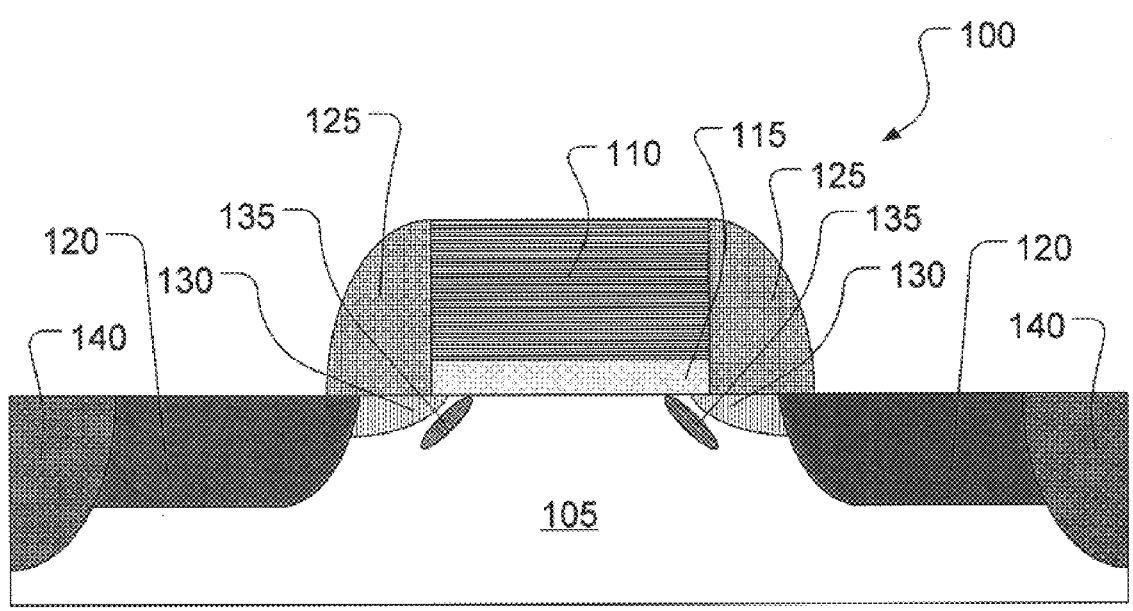
FIGS. 1–4 illustrate schematically in cross-section conventional angled halo implantation techniques.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Illustrative embodiments of a method for semiconductor device fabrication according to the present invention are shown in FIGS. 5–12. Although the various regions and structures of a semiconductor device are depicted in the drawings as having very precise, sharp configurations and profiles, those skilled in the art recognize that, in reality, these regions and structures are not as precise as indicated in the drawings. Nevertheless, the attached drawings are included to provide illustrative examples of the present invention.

In general, the present invention is directed towards the manufacture of a semiconductor device. As will be readily apparent to those skilled in the art upon a complete reading of the present application, the present method is applicable to a variety of technologies, for example, NMOS, PMOS, CMOS, and the like, and is readily applicable to a variety of devices, including, but not limited to, logic devices, memory devices, and the like.

Figure 5:
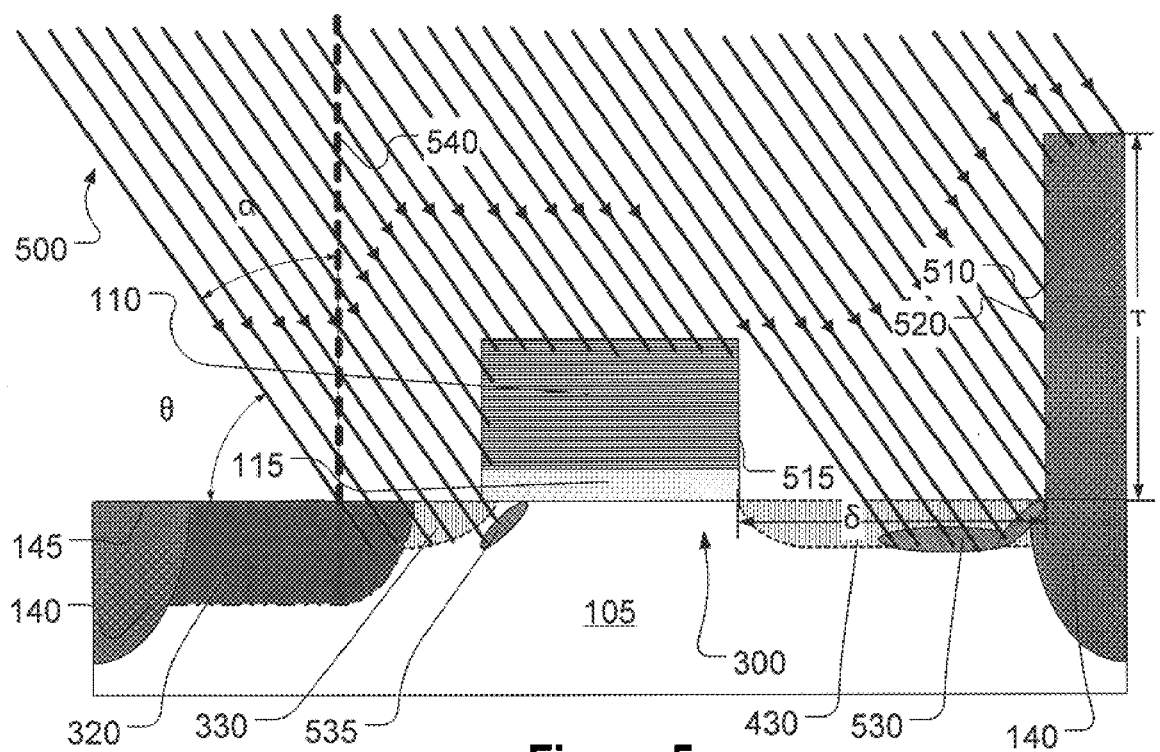
FIGS. 5–12 illustrate schematically in cross-section various embodiments of a method for semiconductor device fabrication according to the present invention.

As shown in FIG. 5, an embodiment of a method for semiconductor device fabrication according to the present invention for implanting the asymmetric P$^-$-doped (N$^-$-doped) angled halo implant 235 is schematically illustrated. A structure 300 (that will eventually become a gate structure for an MOS transistor such as the MOS transistor 200, as described above), having a doped-poly gate 110 and a gate dielectric 115, may be formed above a semiconducting substrate 105, such as doped-silicon.

An LDD or SDE mask 510 may be formed over a shallow trench isolation (STI) region 140 as in conventional CMOS fabrication methods to protect the PMOS (NMOS) transistor regions while the NMOS (PMOS) transistor regions being implanted to form the N-doped (P-doped) SDE regions 330 and 430 (outlined in phantom), for example. The mask 510 may be formed of photoresist, for example, and may have a thickness τ in a range of about 5000 Å–15000 Å. The mask 510 may have an edge 520 disposed a distance δ from an edge 515 of the structure 300. The edge 520 of the mask 510 may be spaced apart from the edge 515 of the structure 300 by the distance δ ranging from approximately 2500–9000 Å, for example.

Figure 2:
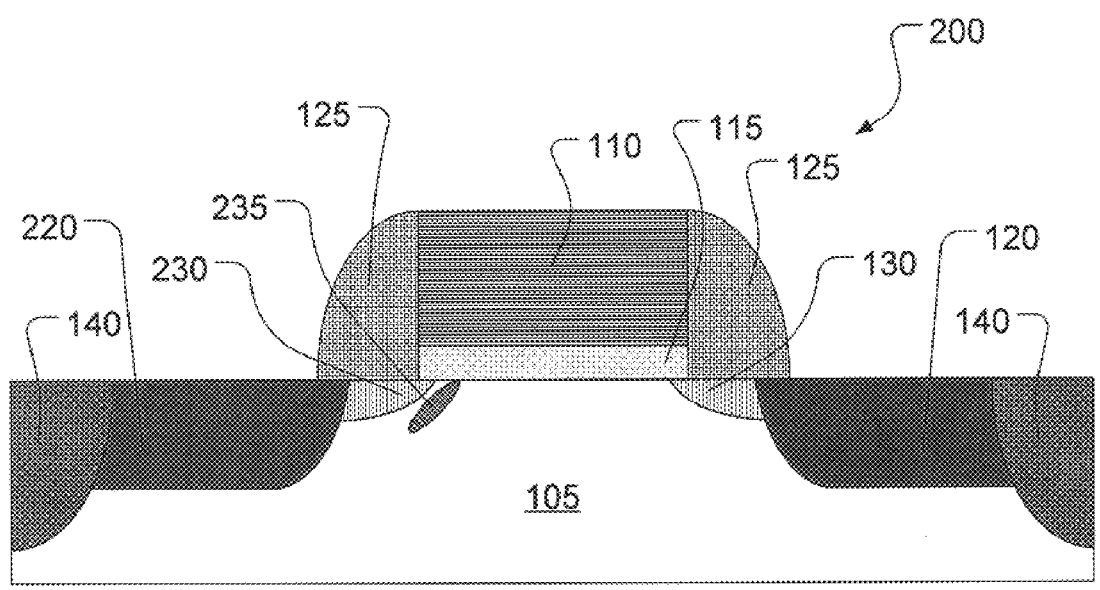

As shown in FIG. 5, a halo dopant 500 (indicated by directed lines) may be implanted to introduce dopant atoms and/or molecules to form the asymmetric P$^-$-doped (N$^-$-doped) angled halo implant 535 only under the lefthand side of the structure 300. In addition to forming the asymmetric P$^-$-doped (N$^-$-doped) angled halo implant 535, the halo dopant 500 may also be implanted into a region 430 (outlined in phantom) that will eventually become the N-doped (P-doped) SDE region 130 (FIGS. 1 and 2), forming a P$^-$-doped (N$^-$-doped) implant 530 partially under the edge 520 of the mask 510, for example.

As shown in FIG. 5, an angle θ of the halo dopant 500 with respect to an upper surface 145 of the semiconducting substrate 105 may lie within a range of about 25°–65°. Similarly, as shown in FIG. 5, an angle α of the halo dopant 500 with respect to a direction 540 (indicated in phantom) substantially perpendicular (or normal) to the upper surface 145 of the semiconducting substrate 105 may lie within a range of about 65°–25°. Generally, the angle α is complementary to the angle θ, so that α+θ=90.0°.

The semiconducting substrate 105 may be tilted at the angle θ with respect to a horizontal direction in an implanter (not shown) and the halo dopant 500 may be directed downward in a vertical direction. Alternatively, the semiconducting substrate 105 could be disposed in the horizontal direction in the implanter (not shown) and the halo dopant 500 could be directed downward at the angle θ with respect to the horizontal direction in the implanter, and/or any other combination of tilt and implant direction could be used as long as the angle θ is the relative angle of the halo dopant 500 with respect to the upper surface 145 of the semiconducting substrate 105.

Figure 6:
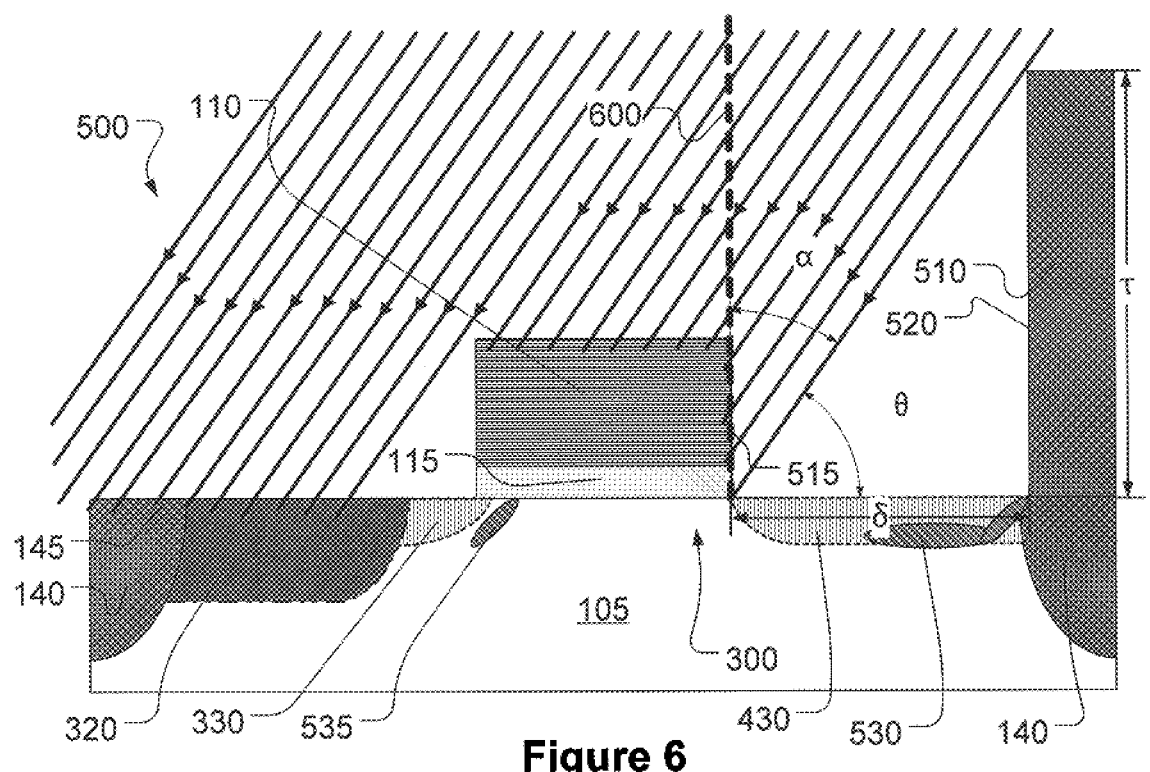

As shown in FIG. 6, after implanting one side of the structure 300, the semiconducting substrate 105 may be rotated through 180° and the halo dopant 500 may again be implanted so that the angle θ is the relative angle of the halo dopant 500 with respect to the upper surface 145 of the semiconducting substrate 105. If the mask 510 were not present, such symmetrical implanting of both sides of the structure 300 would result in symmetrical angled halo implants similar to the angled halo implants 135 shown in FIG. 1. With the mask 510 present, however, as long as the tangent of the angle α is at least the ratio of the distance δ to the thickness τ, symmetrical implanting of both sides of the structure 300 results in an asymmetrical angled halo implant similar to the asymmetrical angled halo implant 535 shown in FIGS. 5 and 6.

As shown in FIG. 6, the angle θ of the halo dopant 500 with respect to the upper surface 145 of the semiconducting substrate 105 may lie within a range of about 25°–65°. Similarly, as shown in FIG. 6, the angle α of the halo dopant 500 with respect to a direction 600 (indicated in phantom) substantially perpendicular (or normal) to the upper surface 145 of the semiconducting substrate 105 may lie within a range of about 65°–25°. The angle α is again complementary to the angle θ, so that α+θ=90.0°. As shown in FIG. 6, the tangent of the angle α is about equal to the ratio δ/τ (of the distance δ from the edge 515 of the structure 300 to the edge 520 of the mask 510 to the thickness τ of the mask 510). If the tangent of the angle α were less than about the ratio δ/τ, then the structure 300 and the mask 510 would not be able to block implantation of the halo dopant 500 under the edge 515 of the structure 300, and symmetrical angled halo implants similar to the angled halo implants 135 shown in FIG. 1 would result.

By way of contrast, however, if the tangent of the angle α were at least about the ratio δ/τ, then the structure 300 and the mask 510 would be able to block implantation of the halo dopant 500 under the edge 515 of the structure 300. An asymmetrical angled halo implant would result, similar to the asymmetrical angled halo implant 535 shown in FIGS. 5 and 6.

In various illustrative embodiments, the distance δ from the edge 515 of the structure 300 to the edge 520 of the mask 510 may be determined by the density of the MOS transistors on the semiconducting substrate 105. Similarly, the angle a of the halo dopant 500 with respect to the direction 600 (indicated in phantom) substantially perpendicular (or normal) to the upper surface 145 of the semiconducting substrate 105 may be determined by that allowable range of tilt angles provided by the implanter (not shown). In these various illustrative embodiments, the thickness τ of the mask 510 may be the only variable that is readily and/or easily adjustable to achieve the desired ratio δ/τ, so that the tangent of the angle α is at least about the ratio δ/τ.

In various alternative illustrative embodiments, the distance δ from the edge 515 of the structure 300 to the edge 520 of the mask 510 may be determined by the density of the MOS transistors on the semiconducting substrate 105. Similarly, the angle a of the halo dopant 500 with respect to the direction 600 (indicated in phantom) substantially perpendicular (or normal) to the upper surface 145 of the semiconducting substrate 105 may be determined by that allowable range of tilt angles provided by the implanter (not shown). In these various alternative illustrative embodiments, the thickness τ of the mask 510 and/or the angle α of the halo dopant 500 with respect to the direction 600 (indicated in phantom) substantially perpendicular (or normal) to the upper surface 145 of the semiconducting substrate 105 may be readily and/or easily adjustable to achieve the desired ratio δ/τ, so that the tangent of the angle α is at least about the ratio δ/τ.

As shown in FIGS. 5 and 6, the halo dopant 500 may also be implanted into a region 330 (outlined in phantom) that will eventually become the N-doped (P-doped) SDE region 230, and into a region 320 (outlined in phantom) that will eventually become the $N^+$-doped ($P^+$-doped) source region 220. However, the dosage of the halo dopant 500 is typically at least an order of magnitude less than the dosage of dopant for the N-doped (P-doped) SDE region 230. Similarly, the halo dopant 500 may also be implanted into the doped-poly gate 110 and/or the gate dielectric 115 and/or the mask 510. However, the doping of the doped-poly gate 110 also typically overwhelms the halo dopant 500 doping in the doped-poly gate 110. Furthermore, the amount of the halo dopant 500 doping in the gate dielectric 115 is typically miniscule, and the mask 510 is ultimately removed, rendering moot the presence of any of halo dopant 500 doping in the mask 510.

In various illustrative embodiments, a dose of the halo dopant 500 atoms and/or molecules may range from approximately $1.0 \times 10^{12} - 1.0 \times 10^{14}$ ions/cm$^2$ of the appropriate halo dopant 500 atoms and/or molecules, e.g., boron (B) or boron difluoride ($BF_2$) for an illustrative NMOS transistor (the p-type halo implant serving to reinforce the p-type doping of the channel region of the NMOS transistor), or arsenic (As) or phosphorus (P) for an illustrative PMOS transistor (the n-type halo implant serving to reinforce the n-type doping of the channel region of the PMOS transistor). An implant energy of the halo dopant 500 atoms and/or molecules may range from approximately 5–70 keV. In one illustrative embodiment, a dose of the halo dopant 500 atoms is approximately $1.0 \times 10^{12}$ ions/cm$^2$ of B for an NMOS transistor at an implant energy of approximately 5 keV or approximately $1.0 \times 10^{12}$ ions/cm$^2$ of As for a PMOS transistor at an implant energy of approximately 40 keV. The depth of the asymmetric $P^-$-doped ($N^-$-doped) angled halo implant 535 below the surface 145 of the semiconducting substrate 105 may range from approximately 0–800 Å.

By way of contrast, a typical dose of dopant for the N-doped (P-doped) SDE region 230 may range from approximately $1.0 \times 10^{14} - 1.0 \times 10^{15}$ ions/cm$^2$ of the appropriate dopant atoms and/or molecules, e.g., As or P for an illustrative NMOS transistor or B or $BF_2$ for an illustrative PMOS transistor. An implant energy of the N-doped (P-doped) SDE region 230 dopant atoms and/or molecules may range from approximately 3–50 keV. Similarly, a typical dose of dopant for the $N^+$-doped ($P^+$-doped) source region 220 may range from approximately $1.0 \times 10^{15} - 5.0 \times 10^{15}$ ions/cm$^2$ of the appropriate dopant atoms and/or molecules, e.g., As or P for an illustrative NMOS transistor or B or $BF_2$ for an illustrative PMOS transistor. An implant energy of the $N^+$-doped ($P^+$-doped) source region 220 dopant atoms and/or molecules may range from approximately 30–100 keV.

The halo dopant 500 may be an $N^-$ implant such as P, As, antimony (Sb), and the like, and will form the $N^-$-doped angled halo implant 535. An $N^-$ implant would be appropriate for the fabrication of a PMOS transistor 200, for example, the n-type halo implant serving to reinforce the n-type doping of the channel region of the PMOS transistor 200. Alternatively, the halo dopant 500 may be a $P^-$ implant such as B, boron fluoride (BF, $BF_2$), Indium (In), and the like, and may form the $P^-$-doped angled halo implant 535. A $P^-$ implant would be appropriate for the fabrication of an NMOS transistor 200, for example, the p-type halo implant serving to reinforce the p-type doping of the channel region of the NMOS transistor 200.

Figure 7:
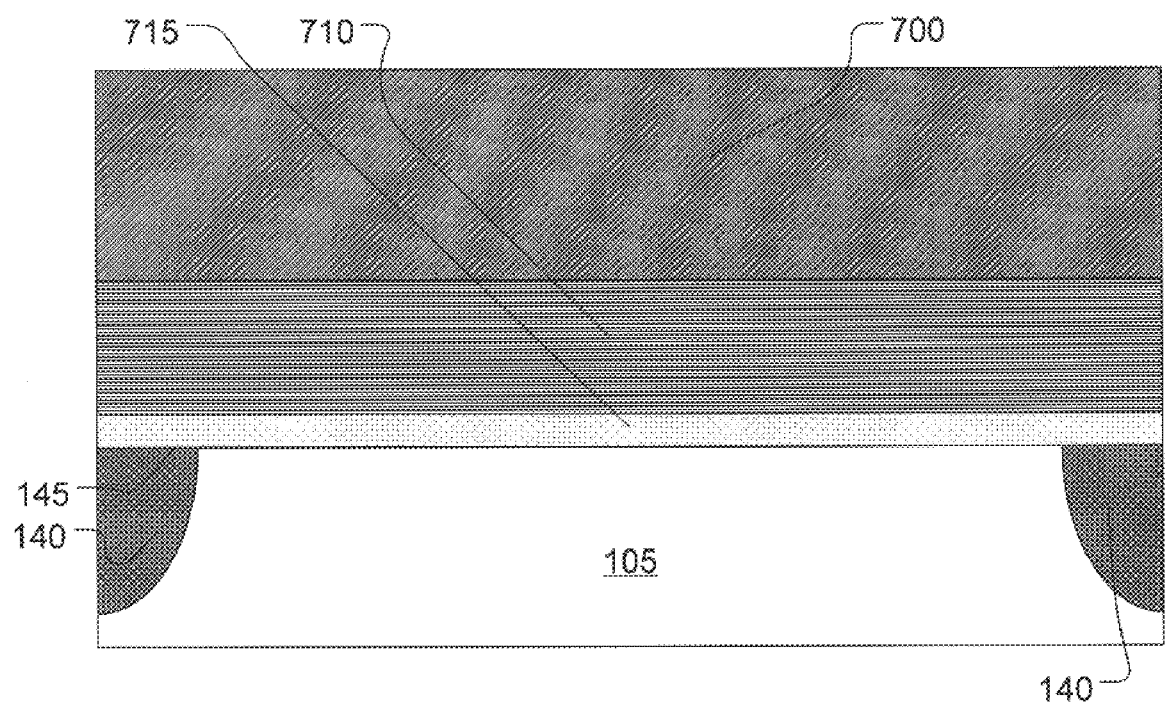

FIGS. 7–12 illustrate a method of forming the structure 300 and the mask 510 according to the present invention. As shown in FIG. 7, a dielectric layer 715 may be formed above an upper surface 145 of a semiconducting substrate 105, such as doped-silicon. The dielectric layer 715 may be formed by a variety of known techniques for forming such layers, e.g., chemical vapor deposition (CVD), low-pressure CVD (LPCVD), plasma-enhanced CVD (PECVD), sputtering and physical vapor deposition (PVD), thermal oxidation, spin-on glass, and the like. The dielectric layer 715 may have a thickness above the upper surface 145 ranging from approximately 10–75 Å, for example, and may be formed from a variety of dielectric materials and may, for example, be an oxide (e.g., Ge oxide), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride ($Si_xO_yN_z$), and the like.

The dielectric layer 715 may also be formed of any suitable "high dielectric constant" or "high K" material, where K is greater than or equal to about 8, such as titanium oxide ($Ti_xO_y$, e.g., $TiO_2$), tantalum oxide ($Ta_xO_y$, e.g., $Ta_2O_5$), barium strontium titanate (BST, $BaTiO_3/SrTiO_3$), and the like. The dielectric layer 715 may have an equivalent oxide thickness $t_{ox-eq}$ ranging from approximately 10–75 Å, for example. An equivalent oxide thickness $t_{ox-eq}$ may be defined to be the thickness t of a dielectric material (with a dielectric constant K) that would have a capacitance (per unit area) C that is approximately the same as the capacitance $C_{ox}$ that a thickness $t_{ox-eq}$, of silicon dioxide ($SiO_2$) would have. Since $SiO_2$ has a dielectric constant $K_{ox}$ of approximately 4, and since $C=K/t$ and $C_{ox}=K_{ox}/t_{ox-eq}$, then $t=K/C=K/C_{ox}=Kt_{ox-eq}/K_{ox}=Kt_{ox-eq}/4$, approximately. For example, the dielectric layer 715 may be formed of a tantalum oxide ($Ta_xO_y$, e.g., $Ta_2O_5$) with a dielectric constant $K_{TaO}$ of approximately 24. Then, using $t=K_{TaO}/C=K_{TaO}/C_{ox}=K_{TaO}t_{ox-eq}/K_{ox}=24t_{ox-eq}/4$ approximately, an equivalent oxide thickness $t_{ox-eq}$ ranging from approximately 10–75 Å would correspond to a $Ta_2O_5$ thickness $t_{Tao}$ ranging from approximately 60–450 Å.

As shown in FIG. 7, a doped-poly layer 710 may be formed above the dielectric layer 715. The doped-poly layer 710 may be formed by a variety of known techniques for forming such layers, e.g., CVD, LPCVD, PECVD, PVD, and the like, and may have a thickness ranging from approximately 1000–2500 Å. In one illustrative embodiment, the doped-poly layer 710 has a thickness of approximately 2000 Å and is formed by an LPCVD process for higher throughput.

The doped-poly layer 710 may doped with arsenic (As) for an NMOS transistor, for example, or boron (B) for a PMOS transistor, to render the polysilicon more conductive. The polysilicon may be formed undoped, by an LPCVD process for higher throughput, to have a thickness ranging from approximately 1000–2500 Å, for example. The doping of the polysilicon may conveniently be accomplished by diffusing or implanting the dopant atoms and/or molecules through the upper surface of the poly. The doped-poly layer 710 may then be subjected to a heat-treating process that may be a rapid thermal anneal (RTA) process performed at a temperature ranging from approximately 800–1100° C. for a time ranging from approximately 5–60 seconds.

As shown in FIG. 7, a layer 700 of photoresist, for example, may be formed above the doped-poly layer 710. The photoresist layer 700 may have a thickness ranging from approximately 5000–15000 Å, for example.

Figure 8:
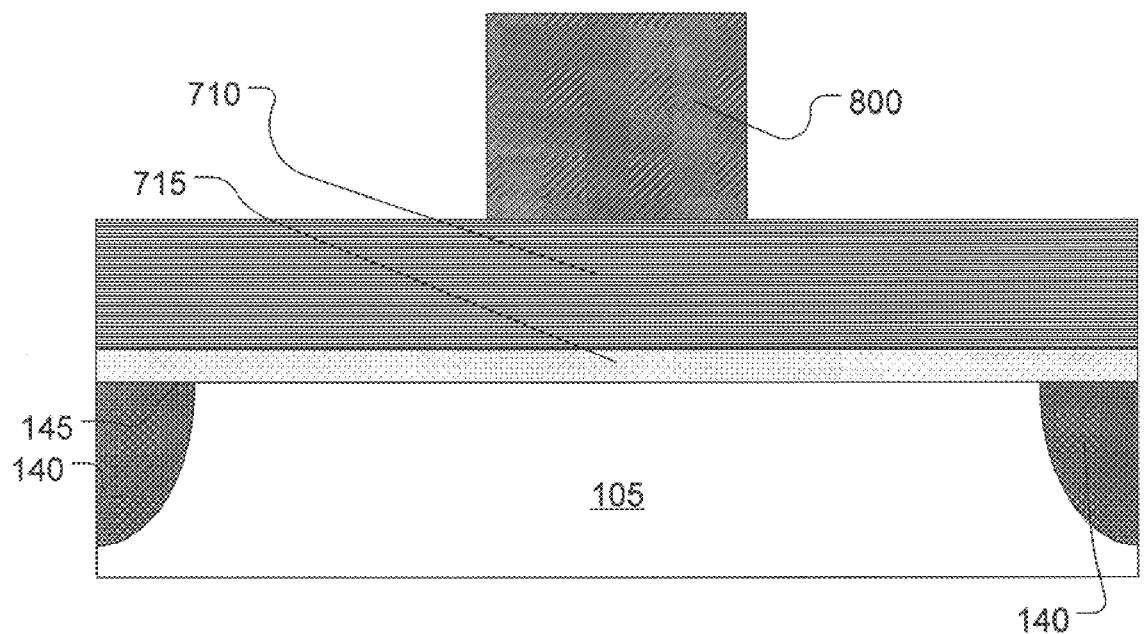
Figure 9:
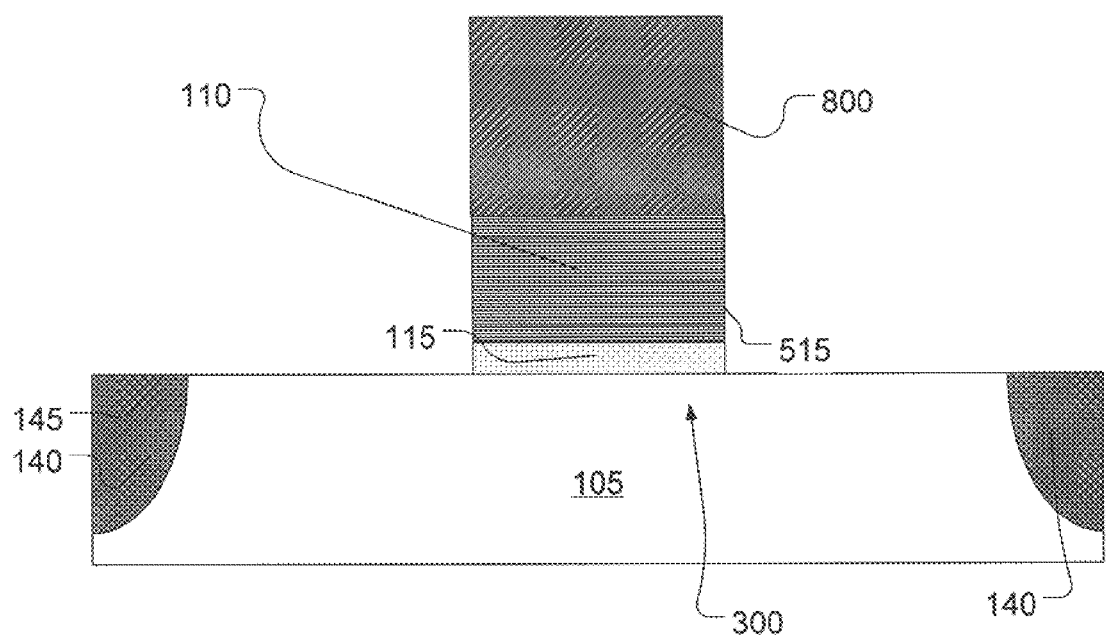
Figure 10:
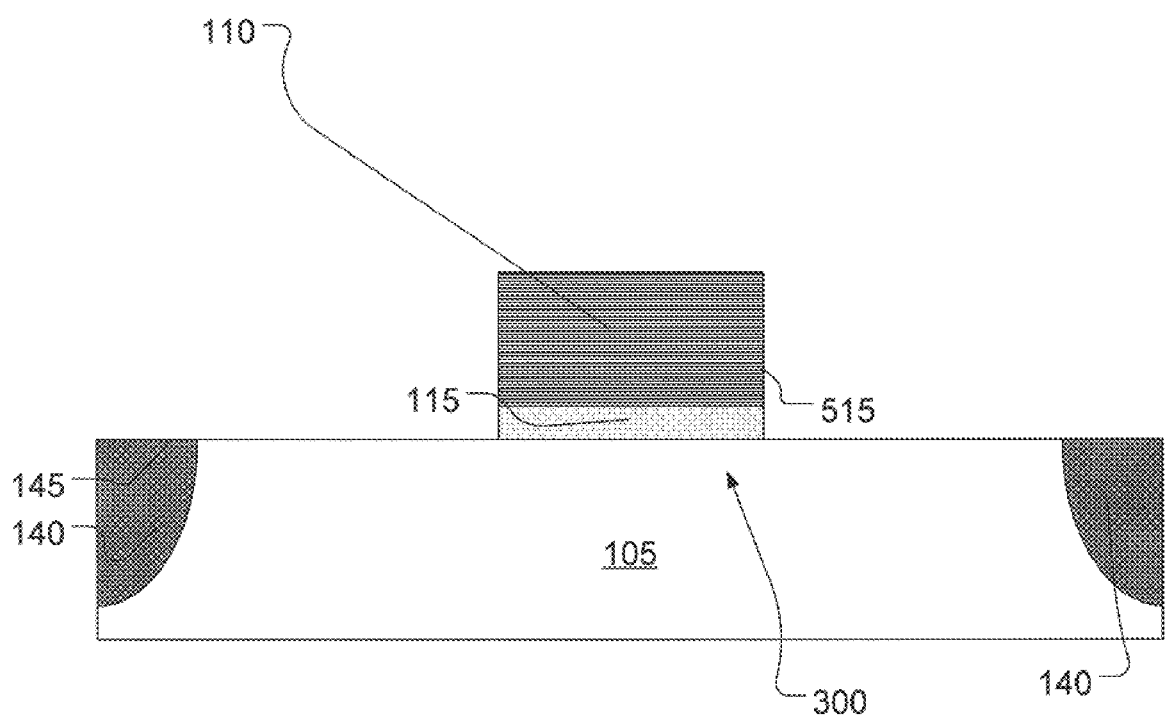

As shown in FIG. 8, the photoresist layer 700 may be patterned to form photoresist mask 800 above the doped-poly layer 710. As shown in FIGS. 8–9, portions of the doped-poly layer 710 and the dielectric layer 715 not protected by the photoresist mask 800 may be removed, by being etched away, for example, forming the structure 300. As shown in FIGS. 8–9, the structure 300 may be formed using a variety of known photolithography and etching techniques, such as an anisotropic etching process using hydrogen bromide (HBr) and argon (Ar) as the etchant gases, for example. As shown in FIG. 10, the photoresist mask 800 (FIGS. 8–9) may be removed, by being stripped away, for example.

Figure 11:
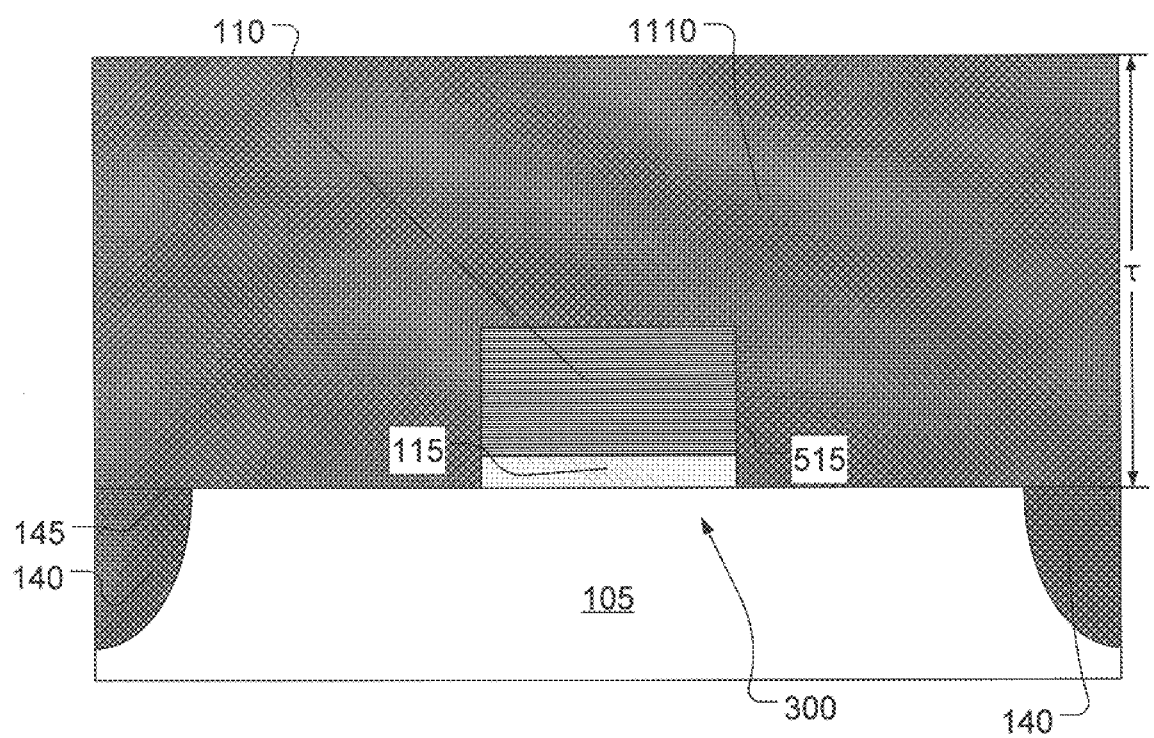

As shown in FIG. 11, a masking layer 1100, formed of photoresist, for example, may be formed above the upper surface 145 of the semiconducting substrate 105, and above and adjacent the structure 300. The masking layer 1100 may have a thickness τ above the upper surface 145 ranging from approximately 500–15000 Å, for example. In various illustrative embodiments, the thickness τ above the upper surface 145 is at most about 5000 Å. In various alternative illustrative embodiments, the thickness τ above the upper surface 145 ranges from approximately 500–2500 Å.

Figure 12:
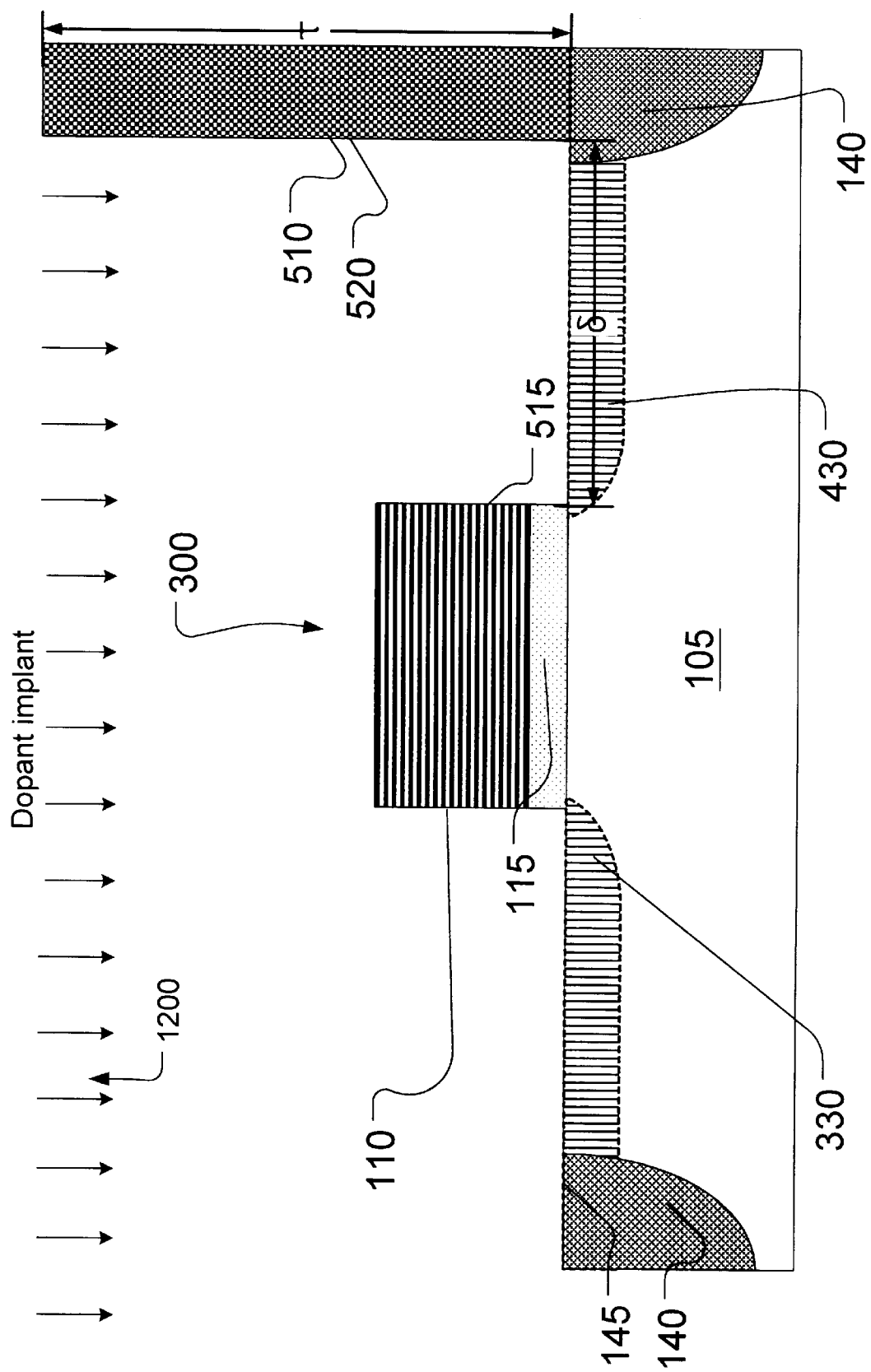

As shown in FIG. 12, the masking layer 1100 may be patterned to form the mask 510 above at least a portion of the shallow trench isolation (STI) 140. The masking layer 1100 may be patterned to form the mask 510 using a variety of known photolithography and/or etching techniques. The mask 510 may have an edge 520 spaced apart from an edge 515 of the structure 300 by a distance δ ranging from approximately 2500–9000 Å, for example. In various illustrative embodiments, the mask 510 may have an edge 520 spaced apart from an edge 515 of the structure 300 by a distance δ ranging from approximately 1000–2500 Å.

The mask 510 may be formed over the STI region 140 as in conventional CMOS fabrication methods to protect the PMOS (NMOS) transistor regions while the NMOS (PMOS) transistor regions are being implanted to form the N-doped (P-doped) SDE regions 330 and 430 (outlined in phantom), for example. As shown in FIG. 12, dopant implant 1200 (indicated by the arrows) may be implanted to form the N-doped (P-doped) SDE regions 330 and 430 (outlined in phantom) either before or after the halo dopant 500 (indicated by the directed lines in FIGS. 5–6) is implanted to introduce dopant atoms and/or molecules to form the asymmetric P⁻-doped (N⁻-doped) angled halo implant 535 only under the left-hand side of the structure 300.

Any of the above-disclosed embodiments of a method for fabricating a semiconductor device according to the present invention provides for increased operating speed and improved efficiency and performance of the semiconductor device. Additionally, the present invention allows formation of semiconductor devices without forcing the circuit designers to severely restrict the layout of the MOS transistors so that all the "sources" (e.g. the sides of the MOS transistors that receive the asymmetric halo implant) are in the same orientation and without using an additional deep ultraviolet (DUV) or expensive masking layer to define just the "source" side of all the MOS transistors.

Figure 3:
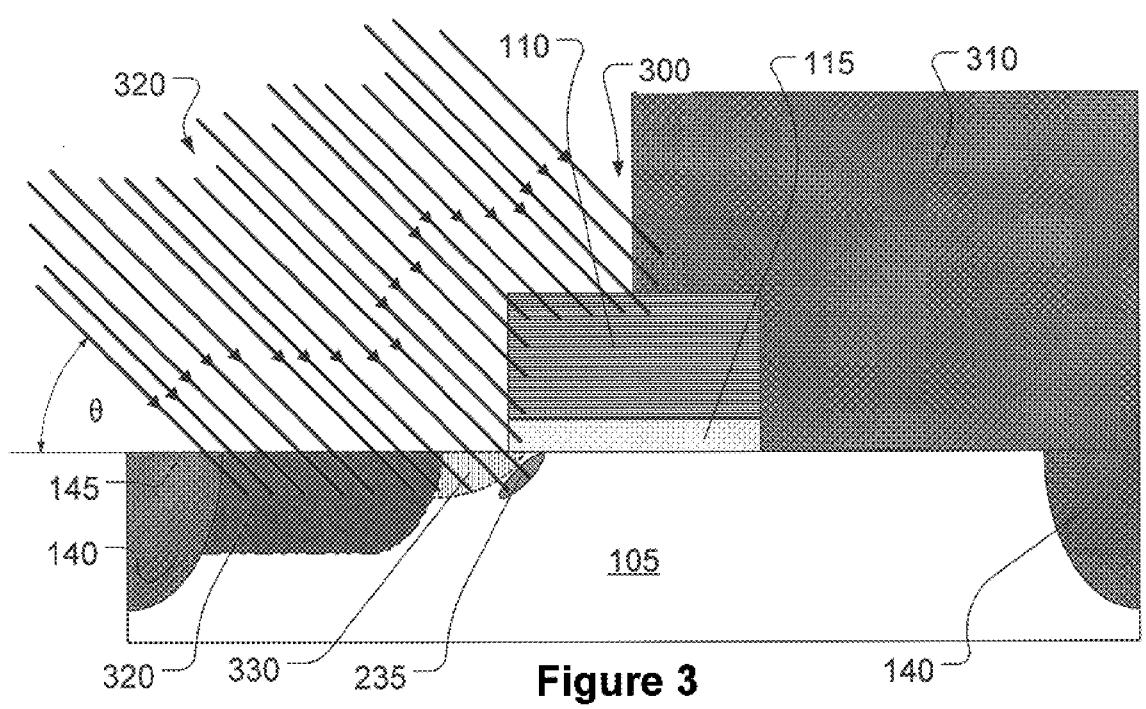

For example, as discussed above, the conventional technique schematically illustrated in FIG. 3 for implanting the asymmetric P⁻-doped (N⁻-doped) angled halo implant 235 necessarily entails an extra masking step to form the mask 310, adding yet another layer of complexity, increasing further the costs of fabrication and reducing throughput. By way of contrast, the present invention allows formation of semiconductor devices without using an additional deep ultraviolet (DUV) or expensive masking layer, such as the mask 310, to define just the "source" side of all the MOS transistors.

Figure 4:
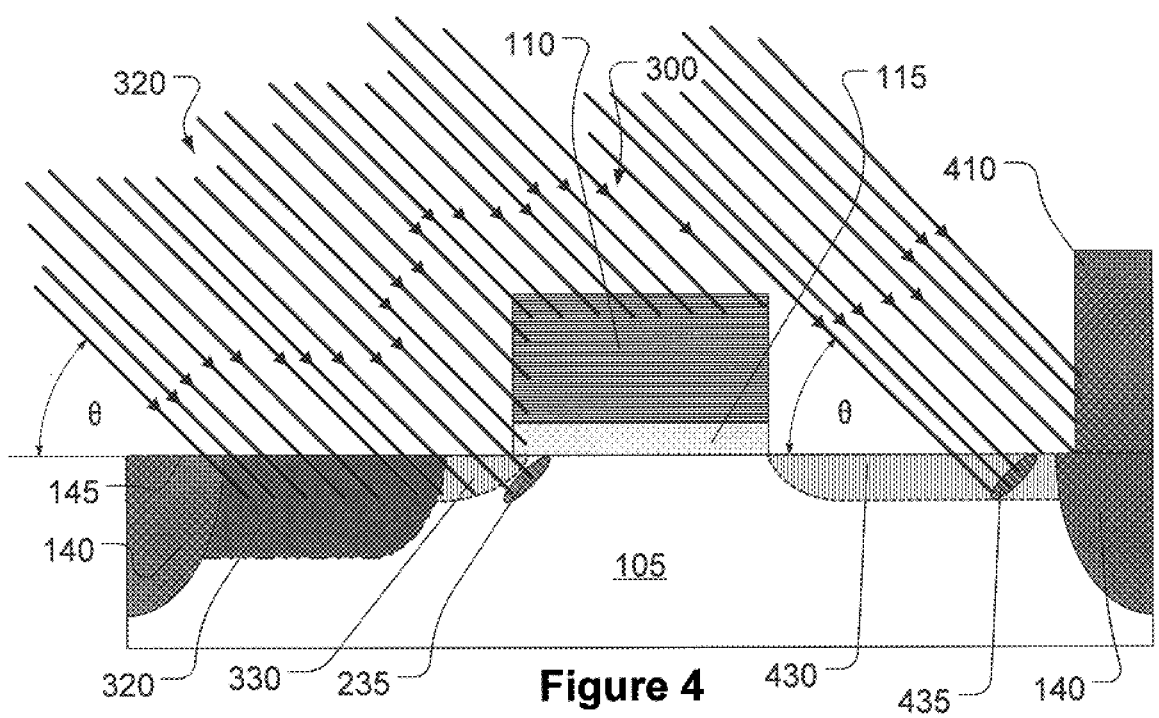

Alternative conventional techniques for implanting the asymmetric P⁻-doped (N⁻-doped) angled halo implant 235, as shown in FIG. 4, impose severe restrictions on the design and layout of the MOS transistors on a workpiece (such as the semiconducting substrate 105 in FIG. 3) so that all of the N⁺-doped (P⁺-doped) source regions 220 are on the same side of the gate structures (such as structure 300 in FIG. 3).

As shown in FIG. 4, these alternative conventional techniques then use LDD or SDE mask(s) as mask(s) 410 to form the asymmetric P⁻-doped (N⁻-doped) angled halo implant 235. The LDD or SDE mask(s) 410 are used in conventional CMOS fabrication methods to protect the PMOS (NMOS) transistor regions while the NMOS (PMOS) transistor regions are being implanted to form the N-doped (P-doped) SDE regions 330 and 430 (outlined in phantom), for example. The angled halo dopant 320 is thus only implanted under one side of the gate structure(s) 300, the side having the region 320 (also outlined in phantom) that will eventually become the N⁺-doped (P⁺-doped) source region 220. However, the severe design and layout restrictions result in a sparser and less dense packing of the CMOS transistors on the workpiece and the addition of yet another layer of design and layout complexity, increasing the costs of fabrication and also reducing overall throughput. By way of contrast, the present invention allows formation of semiconductor devices without forcing the circuit designers to severely restrict the layout of the MOS transistors so that all the "sources" are in the same orientation. This enables semiconductor device fabrication with increased device density and precision, and enables a streamlined and simplified process flow. This decreases the complexity, and lowers the costs, of the manufacturing process, increasing reliability and throughput.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. In particular, all ranges of values (of the form, "from about a to about b," or, equivalently, "from approximately a to b," or, equivalently, "from approximately a–b") disclosed herein are to be understood as referring to the power set (the set of all subsets) of the respective ranges of values, in the sense of Georg Cantor. Accordingly, the protection sought herein is as set forth in the claims below.

What is claimed:

1. A method of forming a halo implant in a substrate adjacent one side of a structure, the method comprising:
   forming the structure above a surface of the substrate, the structure having first and second edges;
   forming a mask defining regions adjacent the structure, the mask having a thickness $\tau$ above the surface and having an edge disposed a distance $\delta$ from the first edge of the structure;
   implanting the halo implant at an angle $\alpha$ with respect to a direction perpendicular to the surface, wherein the tangent of the angle $\alpha$ is at least the ratio of the distance $\delta$ to the thickness $\tau$; and
   introducing a dopant into the regions adjacent the structure.

2. The method of claim 1, the method further comprising:
   rotating the substrate through approximately 180° ($\pi$ radians); and
   implanting the halo implant at the angle $\alpha$ with respect to the direction perpendicular to the surface.

3. The method of claim 1, wherein forming the structure above the surface of the substrate includes forming a gate structure for a MOSFET.

4. The method of claim 3, wherein forming the gate structure includes forming a gate dielectric above the surface of the substrate and forming a gate conductor above the gate dielectric.

5. The method of claim 4, wherein forming the gate conductor includes forming a polysilicon gate conductor.

6. The method of claim 3, wherein forming the mask defining the regions adjacent the structure includes forming a photoresist mask defining a source/drain extension (SDE) adjacent the gate structure.

7. The method of claim 6, wherein forming the photoresist mask defining the source/drain extension (SDE) adjacent the gate structure includes forming the photoresist mask to have the thickness $\tau$ above the surface of at most about 5000 Å.

8. The method of claim 6, wherein forming the photoresist mask defining the source/drain extension (SDE) adjacent the gate structure includes forming the photoresist mask to have the thickness $\tau$ above the surface in a range of about 500 Å to about 2500 Å.

9. The method of claim 3, wherein implanting the halo implant at the angle $\alpha$ with respect to the direction perpendicular to the surface includes implanting the halo implant at the angle $\alpha$ in a range of about 25° ($\pi/7.2$ radians) to about 65° ($\pi/2.8$ radians) with respect to the direction perpendicular to the surface.

10. The method of claim 3, wherein implanting the halo implant at the angle $\alpha$ with respect to the direction perpendicular to the surface includes implanting the halo implant at the angle $\alpha$ of about 45° ($\pi/4$ radians) with respect to the direction perpendicular to the surface.

11. A method of forming a halo implant in a substrate adjacent one side of a structure, the method comprising:
    forming the structure above a surface of the substrate, the structure having first and second edges;
    forming a mask defining regions adjacent the structure, the mask having a thickness $\tau$ above the surface and having an edge disposed a distance $\delta$ from the first edge of the structure;
    implanting the halo implant at an angle $\alpha$ with respect to a direction perpendicular to the surface, wherein the tangent of the angle $\alpha$ is at least the ratio of the distance $\delta$ to the thickness $\tau$; and
    introducing a dopant into the regions adjacent the structure after implanting the halo implant.

12. The method of claim 11, the method further comprising:
    rotating the substrate through approximately 180° ($\pi$ radians); and
    implanting the halo implant at the angle $\alpha$ with respect to the direction perpendicular to the surface.

13. The method of claim 11, wherein forming the structure above the surface of the substrate includes forming a gate structure for a MOSFET.

14. The method of claim 13, wherein forming the gate structure includes forming a gate dielectric above the surface of the substrate and forming a gate conductor above the gate dielectric.

15. The method of claim 14, wherein forming the gate conductor includes forming a polysilicon gate conductor.

16. The method of claim 13, wherein forming the mask defining the regions adjacent the structure includes forming a photoresist mask defining a source/drain extension (SDE) adjacent the gate structure.

17. The method of claim 16, wherein forming the photoresist mask defining the source/drain extension (SDE) adjacent the gate structure includes forming the photoresist mask to have the thickness $\tau$ above the surface of at most about 5000 Å.

18. The method of claim 16, wherein forming the photoresist mask defining the source/drain extension (SDE) adjacent the gate structure includes forming the photoresist mask to have the thickness $\tau$ above the surface in a range of about 500 Å to about 2500 Å.

19. The method of claim 13, wherein implanting the halo implant at the angle $\alpha$ with respect to the direction perpendicular to the surface includes implanting the halo implant at the angle $\alpha$ in a range of about 25° ($\pi/7.2$ radians) to about 65° ($\pi/2.8$ radians) with respect to the direction perpendicular to the surface.

20. The method of claim 13, wherein implanting the halo implant at the angle $\alpha$ with respect to the direction perpendicular to the surface includes implanting the halo implant at the angle $\alpha$ of about 45° ($\pi/4$ radians) with respect to the direction perpendicular to the surface.

* * * * *